United States Patent
Ward et al.

(10) Patent No.: US 8,558,192 B2
(45) Date of Patent: Oct. 15, 2013

(54) GAS DELIVERY SYSTEM WITH VOLTAGE GRADIENT FOR AN ION MICROSCOPE

(75) Inventors: Billy W. Ward, Boyce, LA (US); John Notte, IV, Gloucester, MA (US); Randall G. Percival, Raymond, NH (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 13/276,836

(22) Filed: Oct. 19, 2011

(65) Prior Publication Data

US 2012/0145896 A1 Jun. 14, 2012

Related U.S. Application Data

(63) Continuation of application No. PCT/US2010/033844, filed on May 6, 2010.

(60) Provisional application No. 61/177,503, filed on May 12, 2009.

(51) Int. Cl.
*H01J 37/08* (2006.01)
*H01J 37/28* (2006.01)

(52) U.S. Cl.
USPC ............... 250/423 F; 250/423 R; 250/424

(58) Field of Classification Search
USPC ............................ 250/423 R, 424, 423 F
See application file for complete search history.

(56) References Cited

U.S. PATENT DOCUMENTS

| | | | |
|---|---|---|---|
| 2,809,314 A | 10/1957 | Herb | |
| 5,438,205 A | 8/1995 | Schroaeder | |
| 6,515,290 B1 * | 2/2003 | Rzeszut et al. | 250/492.21 |
| 7,326,926 B2 * | 2/2008 | Wang | 250/288 |
| 2007/0138388 A1 | 6/2007 | Ward et al. | |
| 2007/0158558 A1 | 7/2007 | Ward et al. | |
| 2007/0215802 A1 | 9/2007 | Ward et al. | |
| 2008/0220596 A1 * | 9/2008 | Olander et al. | 250/424 |
| 2009/0020708 A1 | 1/2009 | Winkler et al. | |
| 2009/0230299 A1 | 9/2009 | Shichi et al. | |
| 2010/0084582 A1 * | 4/2010 | Lischer et al. | 250/492.21 |

FOREIGN PATENT DOCUMENTS

| | | |
|---|---|---|
| DE | 10 2008 020 145 A | 11/2008 |
| EP | 1 936 653 | 6/2008 |
| JP | 62-098543 | 5/1987 |
| JP | 63-175318 | 7/1988 |

OTHER PUBLICATIONS

Descoins Marion et al., "Local supply of gas in vacuum: Application to a field ion source", J Vac. Sci. Technol. A 26(5), Aug. 28, 2008, pp. 1331-1335.
The International Search Report and a Written Opinion from the counterpart PCT Application No. PCT/US2010/033844, dated Dec. 8, 2010.
International Preliminary Report on Patentability, from the counterpart Application No. PCT/US2010/033844, dated Sep. 15, 2011.

* cited by examiner

*Primary Examiner* — Phillip A Johnston
*Assistant Examiner* — Brooke Purinton
(74) *Attorney, Agent, or Firm* — Fish & Richardson P.C.

(57) ABSTRACT

Disclosed are systems and methods for applying a voltage gradient to a gas delivery system, delivering a gas through a length of the gas delivery system having the voltage gradient, the gas having a pressure-distance product of less than about $1 \times 10^{-2}$ Torr-inches or greater than about 100 Torr-inches, and delivering the gas into a housing of an ion microscope, the housing including an emitter and an extractor.

22 Claims, 11 Drawing Sheets

GAS DELIVERY SYSTEM WITH VOLTAGE GRADIENT FOR AN ION MICROSCOPE

CROSS-REFERENCE TO RELATED APPLICATIONS

This application is a continuation of, and claims benefit under 35 USC 120 to, international application PCT/US2010/033844, filed May 6, 2010, which claims benefit under 35 USC 119(e) of U.S. Ser. No. 61/177,503, filed May 12, 2009. International application PCT/US2010/033844 is hereby incorporated by reference in its entirety.

TECHNICAL FIELD

This disclosure relates to producing charged particles, and in particular, to producing charged particle beams in microscope systems. More particularly, this disclosure relates to gas delivery and gas delivery systems for a microscope system.

BACKGROUND

Samples can be exposed to charged particles for a variety of applications, including sample imaging. Charged particle beams can be formed by ionizing gas particles in a chamber. A relatively small fraction of the gas particles that are introduced into the chamber may be ionized to form the charged particles.

SUMMARY

This disclosure generally relates to charged particle systems that produce ion beams which are used for measurement of sample properties, including imaging of samples.

In general, in a first aspect, the disclosure features a method that includes applying a voltage gradient to a gas delivery system. The gradient includes a voltage drop, V, over a distance, d. The pressure, P, in this region is controlled so that the applied voltage, V, is less than the corresponding value for ionization as given by the Paschen curve. The Pascen curve is an experimentally measured functional relationship between product of pressure and distance (P×d), and the minimum applied voltage for ionization, $V_{ionization}$.

In general, in another aspect, the disclosure features a method that includes applying a voltage gradient to a gas delivery system. The method also includes delivering a gas through a length of the gas delivery system having the voltage gradient, the gas having a pressure-distance product of less than about $1\times10^{-2}$ Torr-inches or greater than about 100 Torr-inches. The method also includes delivering the gas into a housing of an ion microscope, the housing including an emitter and an extractor.

Embodiments can include one or more of the following.

The gas pressure in the length of the gas delivery system having the voltage gradient is less than $10E^{-2}$ Torr, or greater than about 100 Torr.

Applying the voltage gradient can include applying the voltage gradient without ionizing the gas. Delivering the gas into the housing can include delivering the gas through an orifice in the emitter. A maximum absolute value of the potential across the voltage gradient can be within about 20% of a maximum absolute value of a potential of the emitter. A maximum absolute value of the potential of the voltage gradient can be within about 10% of a maximum absolute value of a potential of the emitter.

Delivering the gas into the housing can include delivering the gas through an orifice in the extractor. A maximum absolute value of the potential across the voltage gradient can be within about 20% of a maximum absolute value of a potential of the extractor. A maximum absolute value of the potential of the voltage gradient can be within about 10% of a maximum absolute value of a potential of the extractor.

Delivering the gas into the housing can include delivering the gas through an orifice in a suppressor. A maximum absolute value of the potential across the voltage gradient can be within about 20% of a maximum absolute value of a potential of the suppressor. A maximum absolute value of the potential of the voltage gradient can be within about 10% of a maximum absolute value of a potential of the suppressor.

The method can also include prior to applying the voltage gradient, reducing a pressure of the gas in the gas delivery system. Reducing the pressure can include reducing the pressure to a pressure of less than about $1\times10^{-2}$ Torr. Reducing the pressure of the gas in the gas delivery system can include directing the gas through one or more flow control devices.

The method can also include prior to applying the voltage gradient, maintaining the gas in the gas delivery system at a pressure of greater than about 1000 Torr and subsequent to applying the voltage gradient reducing a pressure to any desired level.

Applying the voltage gradient can include applying the voltage gradient to a portion of the gas delivery system in which the gas is at a pressure of less than about $1\times10^{-2}$ Torr (e.g., less than about $1\times10^{-2}$ Torr, less than about $1\times10^{-3}$ Torr, less than about $1\times10^{-4}$ Torr) or greater than about 500 Torr (e.g., greater than about 500 Torr, greater than about 1000 Torr). These examples are representative, the governing criteria is that the pressure is too high for continuous ionization, or too low for continuous ionization. This, according to the Paschen law is governed by the product of pressure and length.

Applying the voltage gradient can include applying a voltage gradient of greater than about 5 kV (e.g., greater than about 5 kV, greater than about 10 kV).

The gas can be a noble gas such as Helium

In another aspect, the disclosure features a system that includes an ion microscope having a housing containing an emitter, an extractor and a suppressor, at least one of the emitter, extractor and suppressor having an orifice. The system also includes a gas delivery system configured to provide a path for gas flow between a gas supply and the orifice, the gas delivery system including a device configured to apply a voltage gradient across a portion of the gas delivery system.

Embodiments can include one or more of the following features.

The gas delivery system can include a tube configured to transport the gas and the device configured to apply the voltage gradient is attached to a portion of the tube. The gas delivery system can include a flow controller. The flow controller can be configured to reduce the pressure of the gas to less than $1\times10^{-3}$ Torr at the gas exit. The flow controller can be positioned on a gas delivery path between the gas supply and the device configured to apply the voltage gradient. The gas delivery system can include a nozzle positioned at or near the orifice. The nozzle can be configured to maintain the gas in the gas delivery system at a pressure of greater than about 100 Torr prior to the nozzle and introduce the gas into the chamber at a pressure of less than about $1\times10^{-2}$ Torr upon exiting the nozzle. The voltage gradient device can be at a location of the gas delivery system configured to maintain the gas at a pressure of less than about $1\times10^{-2}$ Torr (e.g., less than about $1\times10^{-2}$ Torr, less than about $1\times10^{-3}$ Torr) or at a pressure of greater than about 500 Torr. The orifice can be an orifice in the emitter. The device configured to apply a voltage gradient can be configured to apply a voltage gradient with maximum absolute value of a potential of the voltage gradient within about 20% of a maximum absolute value of a potential of the emitter. The device configured to apply a voltage gradient can be configured to apply a voltage gradient with maximum absolute value of a potential of the voltage gradient within about 10% of a maximum absolute value of a potential of the emitter.

The orifice can be an orifice in the extractor—or a series of orifices. The device configured to apply a voltage gradient can be configured to apply a voltage gradient with maximum absolute value of a potential across the voltage gradient within about 20% of a maximum absolute value of a potential of the extractor. The device configured to apply a voltage gradient can be configured to apply a voltage gradient with maximum absolute value of a potential across the voltage gradient within about 10% of a maximum absolute value of a potential of the extractor.

The orifice can be an orifice in the suppressor. The device configured to apply a voltage gradient can be configured to apply a voltage gradient with maximum absolute value of a potential across the voltage gradient within about 20% of a maximum absolute value of a potential of the suppressor. The device configured to apply a voltage gradient can be configured to apply a voltage gradient with maximum absolute value of a potential across the voltage gradient within about 10% of a maximum absolute value of a potential of the suppressor.

The system can also include a flow control device configured to reduce the pressure of a gas, the flow control device being located prior to the device configured to apply a voltage gradient. The voltage gradient device can be at a location of the gas delivery system configured to be at a pressure of less than about $1 \times 10^{-1}$ Torr or greater than about 100 Torr.

During use, the voltage gradient device can be configured to apply a voltage gradient of at least 5 kV (e.g., at least 5 kV, at least 10 kV, at least 15 kV, at least 25 kV) across the portion of the gas delivery system.

The details of one or more embodiments are set forth in the accompanying drawings and the description below. Other features and advantages will be apparent from the description, drawings, and claims.

DESCRIPTION OF DRAWINGS

Like reference symbols in the various drawings indicate like elements.

DETAILED DESCRIPTION

Typically, charged particle beams such as gas ion beams that are used to interrogate samples are produced in multipurpose microscope systems. Microscope systems that use a gas field ion source to generate ions that can be used in sample analysis (e.g., imaging) are referred to as gas field ion microscopes. A gas field ion source is a device that includes a tip (typically having an apex with 10 or fewer atoms) that can be used to ionize neutral gas species to generate ions (e.g., in the form of an ion beam) by bringing the neutral gas species into the vicinity of the tip (e.g., within a distance of about four to five angstroms) while applying a high positive potential (e.g., one kV or more relative to the extractor (see discussion below)) to the apex of the tip. In some embodiments, the tip can be electrically conductive.

Figure 1:
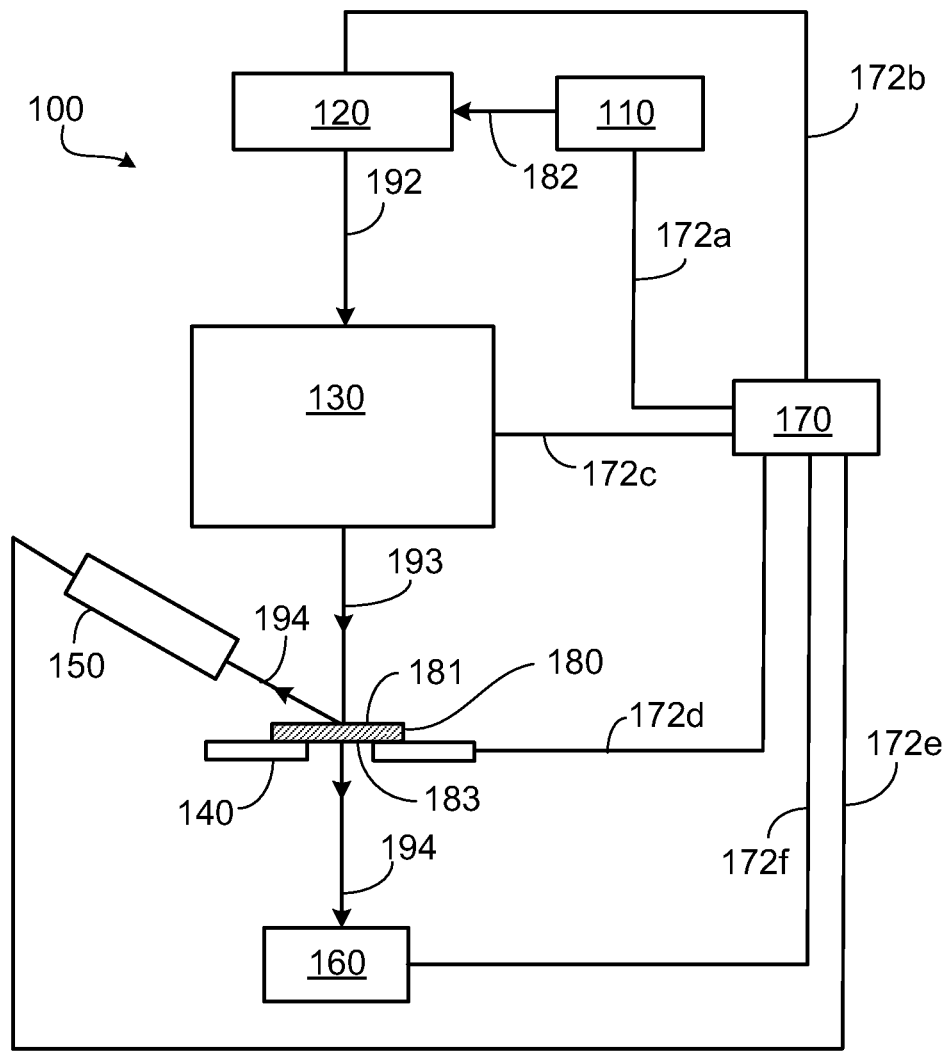
FIG. 1 is a schematic diagram of an ion microscope system.

FIG. 1 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 2:
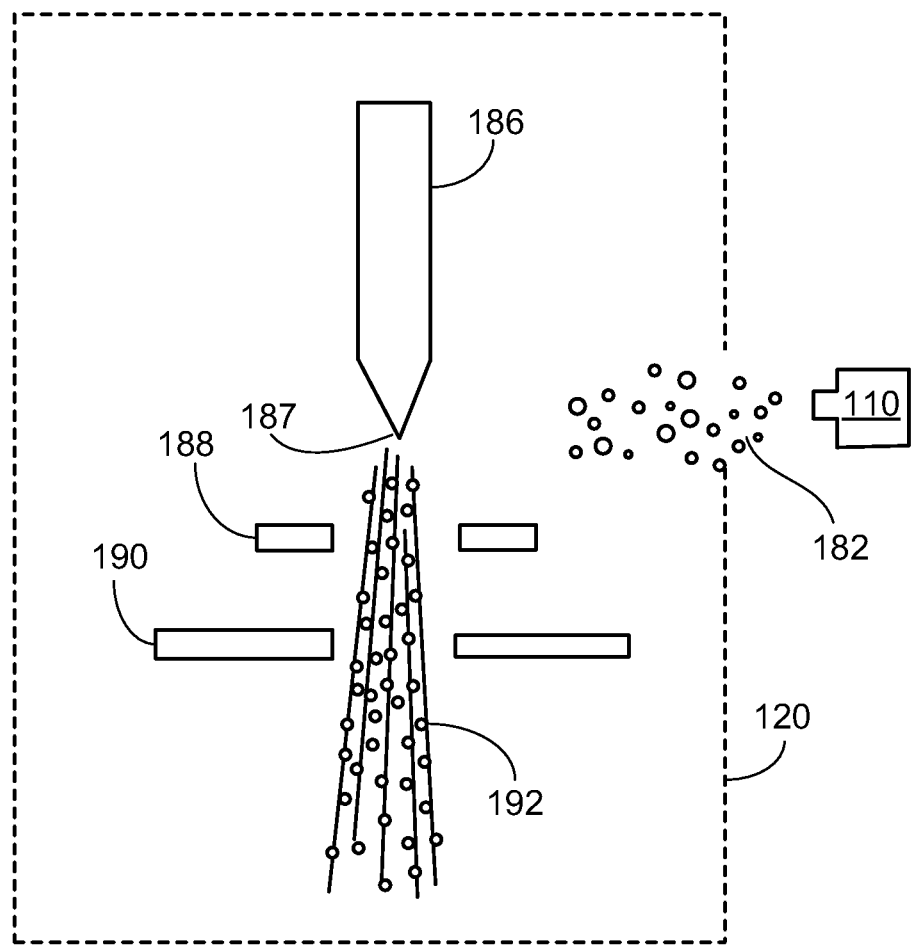
FIG. 2 is a schematic diagram of a gas field ion source.

As shown in FIG. 2, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192.

Optionally, gas source 110 can supply one or more gases in addition to the noble gas(es); an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes a tip 186 with a tip apex 187, an extractor 190 and optionally a suppressor 188.

Tip 186, which can be electrically conductive, can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, an electrically conductive tip 186 can be formed of an alloy. In some embodiments, an electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. When tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between ion beam 192 and sample 180. As shown in FIG. 1, detector 150 is positioned to detect particles 194 that originate primarily from surface 181 of sample 180, and detector 160 is positioned to detect particles 194 that emerge primarily from surface 183 of sample 180 (e.g., transmitted particles). In general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

In certain embodiments, electronic control system 170 can be configured to control various properties of ion beam 192. For example, control system 170 can control a composition of ion beam 192 by regulating the flow of gases into gas field ion source 120. By adjusting various potentials in ion source 120 and ion optics 130, control system 170 can control other properties of ion beam 192 such as the position of the ion beam on sample 180, and the average energy of the incident ions.

Detectors 150 and 160 are depicted schematically in FIG. 1, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and microscope system 200 can typically include any desired number of detectors. The configuration of the various detector(s) can be selected in accordance with particles to be measured and the measurement conditions. In some embodiments, a spectrally resolved detector can be used. Such detectors are capable of detecting particles of different energy and/or wavelength, and resolving the particles based on the energy and/or wavelength of each detected particle.

Ion beam systems and methods are generally disclosed, for example, in U.S. Patent Application Publication No. US 2007/0158558, the entire contents of which are incorporated herein by reference.

Gas Delivery System

Typically in charged particle systems, an emitter that includes a tip is configured to receive a gas (e.g., noble gas such as helium) and produce ions from the gas. The ions are accelerated by the electric field surrounding the tip form an ion beam (e.g., as described above).

Figure 3:
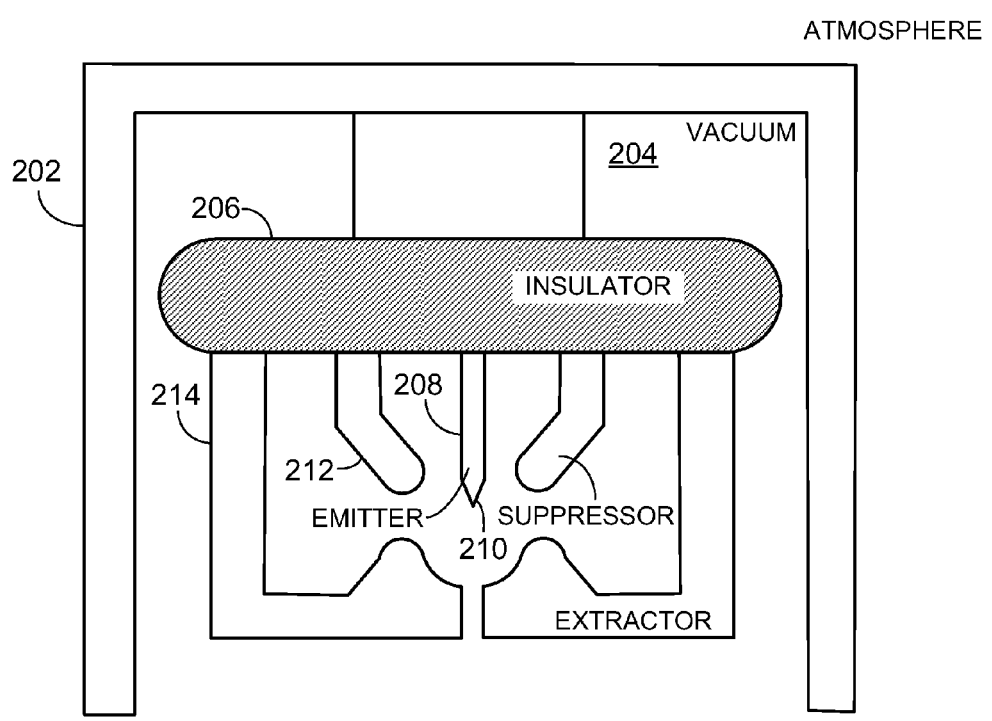
FIG. 3 is a schematic cross-sectional diagram of a housing containing an emitter and an extractor.

FIG. 3 shows an exemplary schematic diagram of an ion source housed in a housing 202. The ion source includes an emitter 208, an extractor 214, and optionally a suppressor 212. In general, a vacuum system maintains a region 204 inside housing 202 at a low pressure (e.g., from about $10^{-2}$ Torr to about $10^{-7}$ Torr). Emitter 208 includes a tip 210 (typically having an apex with 10 or fewer atoms) that ionizes neutral gas species to generate ions (e.g., in the form of an ion beam). As described above, during use, emitter 208 is biased positively (commonly 15-30 kV, but occasionally from 5 to 50 kV) with respect to an extractor 214, extractor 214 is negatively or positively biased (e.g., from −10 kV to +50 kV) with respect to an external ground, and suppressor 212 is biased positively or negatively (e.g., from −5 kV to +5 kV) with respect to tip 210. In one particular exemplary arrangement, emitter 208 can be biased to +25 kV relative to ground and extractor 214 can be biased to −10 kV relative to ground resulting in an extraction potential difference of 35 kV.

Typically, in the ion source, un-ionized gas atoms supplied by a gas delivery system are ionized and become positively-charged ions in the vicinity of tip 210 of emitter 208. The positively-charged ions are simultaneously repelled by positively charged tip 210 and attracted by negatively charged extractor 214 such that the positively-charged ions are directed from tip 208 into ion optics (not shown). Suppressor 212 assists in controlling the overall electric field between emitter 208 and extractor 214 and, therefore, the trajectories of the positively-charged ions from tip 210 to the ion optics. In general, the overall electric field between emitter 208 and extractor 214 can be adjusted to control the rate at which positively-charged ions are produced at tip 210, and the energy with which the positively-charged ions are transported from tip 210 to the ion optics. Electrical connections are not shown for simplicity, but for each electrode a high vacuum feedthrough passes through housing 202 to provide the desired bias to each electrode.

A gas delivery system delivers the gas (e.g., a noble gas such as helium) from a gas source to emitter 208. In some embodiments, the gas supply is located outside of housing 202 (e.g., outside of the region held at low pressure) in a grounded compressed gas cylinder. The gas delivery system provides a path for gas flow between the gas supply and emitter 208 and can include gas purifiers and flow control orifices and valves to control the flow of the gas. It is believed that, in some embodiments for adequate beam current, the gas pressure near the emitter should be from about $10^{-1}$ Torr to about $10^{-5}$ Torr, (e.g., $10^{-2}$ Torr to $10^{-3}$ Torr, $10^{-3}$ Torr to $10^{-4}$ Torr, about $10^3$ Torr). Various types of gas delivery systems can be used to deliver the gas to the emitter.

Figure 4:
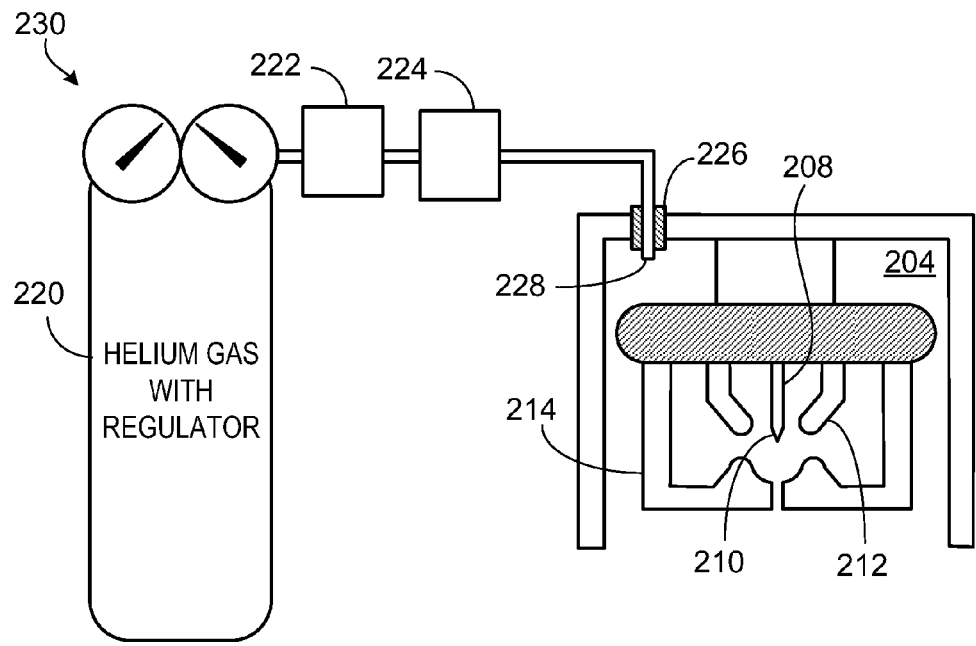
FIGS. 4-7 are schematic diagrams of a portion of an ion microscope system.

FIG. 4 shows an exemplary arrangement 230 of a gas delivery system in which the gas is delivered from a gas supply 220 (e.g., a gas canister) to a region within housing 202. The gas delivery system includes a gas purifier 222, flow control and valves 224, and a gas feed through 226 used to pass the gas through housing 202 and into vacuum chamber 204. During use, gas from gas supply 220 flows through gas purifier 222 and the flow control and valves 224. The gas exits the gas delivery system at an orifice 228 and enters vacuum chamber 204 inside housing 202. In this arrangement, the gas is not delivered directly within the vicinity of emitter 208. Rather, the arrangement relies on the random trajectories of the gas to bring the gas from orifice 228 to emitter 208. One disadvantage of such an arrangement is that a large amount of the gas delivered into vacuum vessel 204 is lost into the vacuum pumps before reaching emitter 208.

Figure 5:
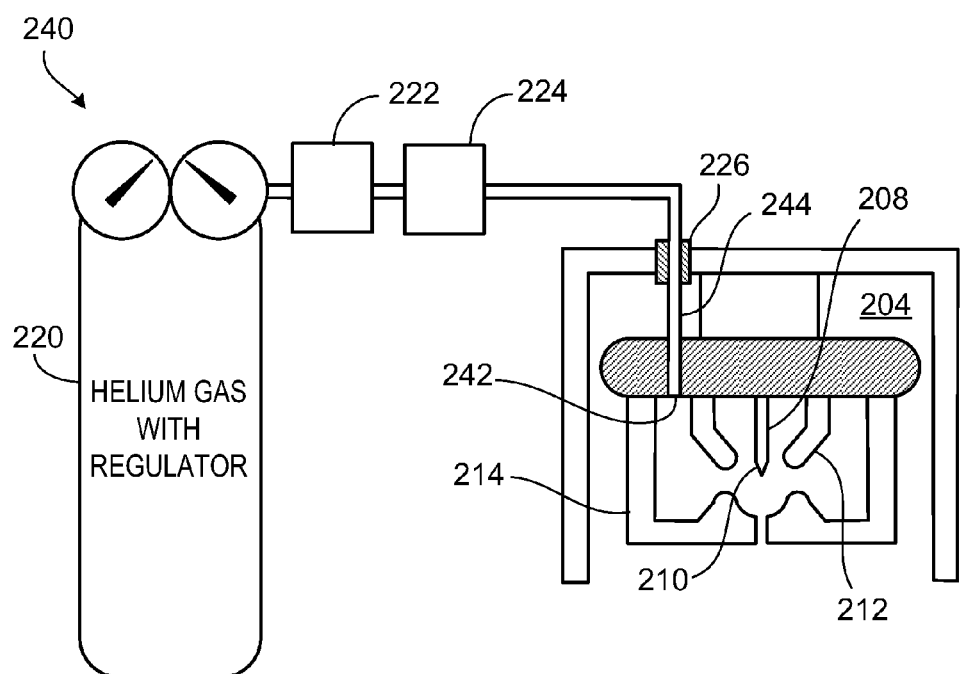

FIG. 5 shows another exemplary arrangement 240 of a gas delivery that delivers the gas closer to emitter 208 than arrangement 230. More particularly, as in arrangement 230, the gas delivery system includes, a gas purifier 222, flow control and valves 224, and a gas feed through 226 used to pass the gas through housing 202 and into vacuum chamber 204. After entering vacuum chamber 204, the gas delivery system includes a portion 244 that extends through the insulator(s) 206. During use, gas from gas supply 220 flows through gas purifier 222, flow control and valves 224 and insulator(s) 206. After passing through insulator(s) 206, the gas exits the gas delivery system at an orifice 242 and enters vacuum chamber 204 at a location near emitter 208. While this arrangement delivers the gas to a location closer to emitter 208, it can increase the complexity of insulator 206 and allows the gas in the insulator to be present in regions of high electric field which can cause the breakdown of the gas or the insulator or both.

Figure 6:
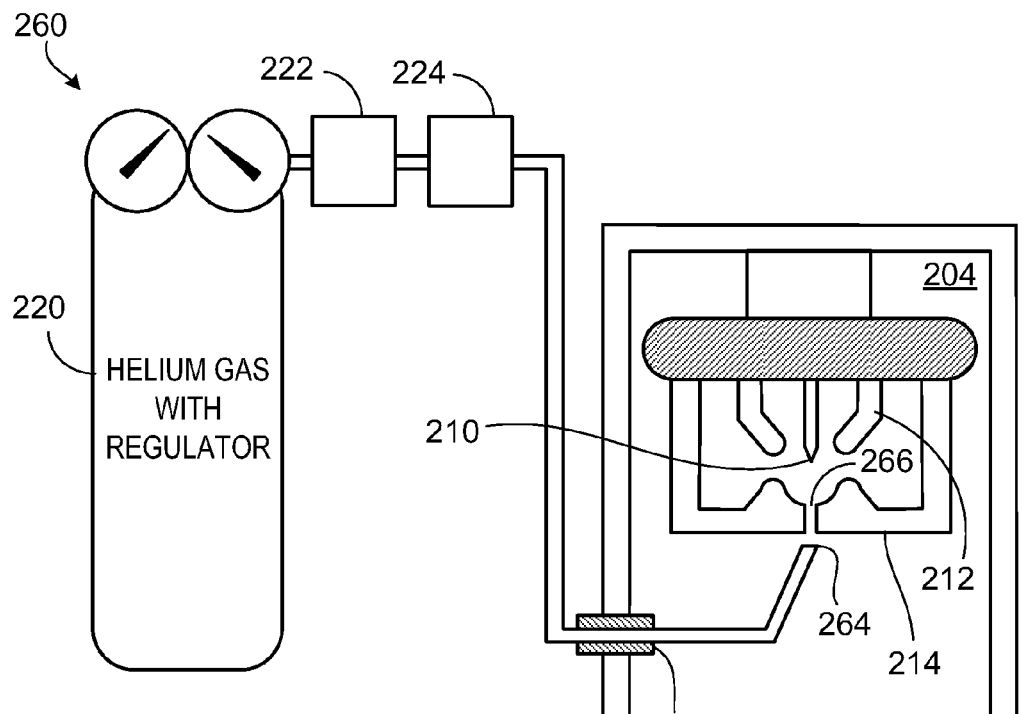
Figure 7:
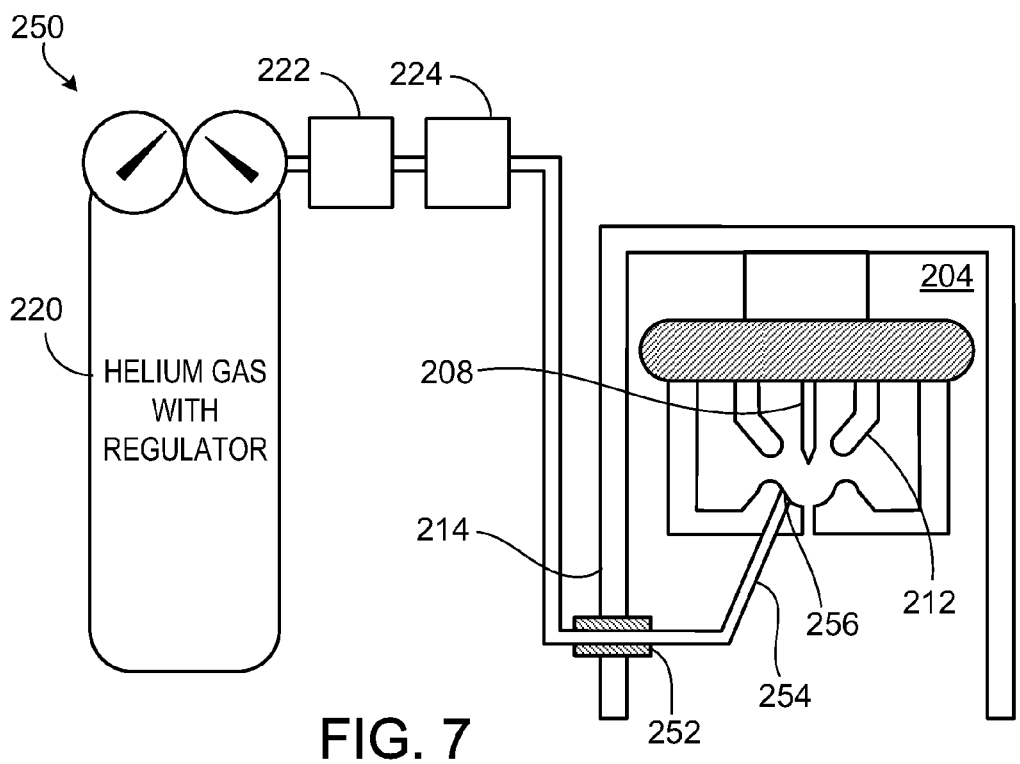

FIGS. 6 and 7 show additional exemplary arrangements 250 and 260 of the gas delivery system. In arrangements 250 and 260, the gas delivery system delivers the gas through a nozzle or orifice (256, 264) directed at emitter 208. More particularly, arrangements 250 and 260 each include, a gas purifier 222, flow control and valves 224, and a gas feed through 252, 263. After entering vacuum chamber 204, the gas delivery system includes a portion that directs the gas toward emitter 208. During use, gas from gas supply 220 flows through gas purifier 222 and flow control and valves 224. The gas exits the gas delivery system at an orifice (e.g., orifice 256 in FIG. 7 or orifice 264 in FIG. 6) and enters vacuum chamber 204 at a location near emitter 208. In the arrangements 250 and 260, the electric field in the region where the gas enters vacuum chamber 204 is established by the electrodes (e.g., extractor 214, emitter 208, and/or suppressor 212).

In arrangement 260 shown in FIG. 6, orifice 264 is located below extractor 214 and aimed toward emitter 208 through a beam hole 266 in extractor 214. While this arrangement directs the gas toward emitter 208, it is believed that the efficiency may be limited due to the tendency for the gas to disperse within housing 202.

In arrangement 250 shown in FIG. 7, the gas delivery nozzle (e.g., orifice 256) is included in extractor 214. While it can be beneficial to deliver the gas to a location near emitter 208 by delivering the gas through extractor 214. Arrangement 260 requires extractor 214 to be held at a grounded potential to prevent the gas from ionizing prior to introduction of the gas into chamber 204. It is believed that including the gas delivery nozzle in extractor 214 can limit the available beam energies because the extractor is operated at ground rather than at a larger potential (e.g., a large positive or negative potential) to avoid ionization of the gas as the gas passes through the extractor electrode.

In general, many gasses will ionize and remain ionized when they are subject to a large electric field (sometimes referred to as the Paschen effect). For example, in the arrangement shown in FIG. 6, when the gas passes through extractor 214, if extractor 214 is biased with a large potential (positive or negative) the electric field generated by the change in voltage could cause the gas in the gas delivery system to ionize.

Figure 8:
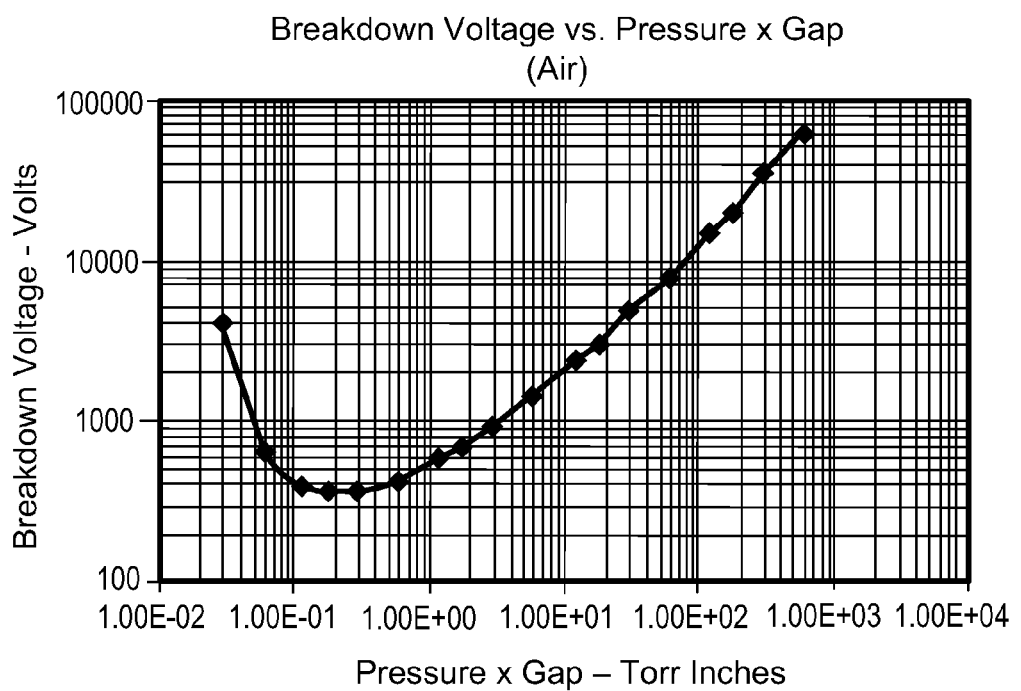
FIG. 8 is a diagram of a Paschen curve.

FIG. 8 shows an exemplary Paschen curve showing the breakdown voltage of a gas at various pressures. The Paschen curve is based on the Paschen equation which provides the breakdown of a gas as a function of pressure (p) and gap distance (d). In general, the breakdown voltage is the voltage necessary to cause the gas to arc across a gap. In general, the breakdown voltage is lower at intermediate values of pressure times distance (e.g., $10^{-2}$ torr inches<pxd<500 torr inches in comparison to low or high values of pressure times distance such as pxd<10–2 torr inches or pxd>500 torr inches). As shown in the Paschen curve the breakdown voltage or ionization voltage of the gas is increased at values of pressure times distance (e.g., values of pressure times distance greater than about 500 Torr inches) or low pressures (e.g., values of pressure times distance pressures less than about $1\times10^{-2}$ Torr inches). Without wishing to be bound by theory, it is believed that the gas is less likely to ionize upon application of a voltage at low pressure because an ion or electron can accelerate a substantial distance in an electric field and have a very low chance of colliding with another gas atom and causing an ionization cascade. At high pressures the gas is less likely to ionize with the application of a voltage because, the ion or electron loses energy through frequent collisions with gas atoms and does not accumulate enough energy to produce an ionizing collision. However, at intermediate pressures, a continuous ionization can occur because each ionization event can start a cascade of further ionization events.

In some embodiments, it can be beneficial to deliver the gas to a location near emitter 208. For example, the gas can be delivered through an orifice in one of the electrodes such as extractor 214. In general, it is believed that delivering the gas aimed at emitter 208 results in efficient use of the gas. Efficient usage of the gas allows for reduced pumping provisions (cost and vibration). Efficient usage of the gas also allows for simplified gas delivery systems with reduced costs. Aiming the gas at the end of the emitter also has the benefit of reducing the amount of neutral gas that gets into the beam path and can result in undesired neutral gas collisions.

In certain embodiments, it can be beneficial to deliver the gas through extractor 214 while at the same time negatively or positively biasing the extractor (e.g., negatively or positively biasing the extractor at a potential from about −20 kV to about +50 kV). If the extractor is negatively or positively biased and the gas is delivered through the extractor, in order to prevent the gas from ionizing, a suitable voltage gradient (e.g., a voltage that will not alter the electric field in the vicinity of the emitter) can be applied to the gas in the gas delivery system prior to the gas passing through extractor 214. Applying the voltage gradient prior to the extractor 214 raises the potential of the remaining portion(s) of the gas delivery system to the applied voltage. By applying the voltage gradient prior to extractor 214 the gradient can be applied at a location in the gas delivery system where the gas is maintained at either a high pressure region (e.g., a region where pressure times the distance over which the voltage gradient is applied is greater than about 100 Torr inches) or at a low pressure region (e.g., a region where pressure times the distance over which the voltage gradient is applied is less than about $1\times10^{-2}$ Torr inches). As such, the voltage gradient is applied at a location where the gas is not at an intermediate gas pressure or when the gas pressure could pass through region of intermediate gas pressures. By avoiding application of the voltage gradient in a location where the gas is likely to be at an intermediate pressure, the likelihood of the gas ionizing is reduced. In some embodiments, the pressure of the gas in the portion of the gas delivery system where the voltage gradient is applied is either less than about $1\times10^{-2}$ Torr or greater than about 100 Torr.

FIGS. 9-12 show exemplary ion microscope systems that include gas delivery systems that provide a path for gas flow between gas supply 220 and the orifice of housing 202 containing emitter 208 and extractor 214. The gas delivery systems of FIGS. 9-11 each include a device (e.g., devices 304, 338 and 356) that applies a voltage gradient across a portion of the gas delivery system. The voltage gradient device produces a change in voltage, V, over a distance, d. During use, the pressure, P, in this region where the voltage gradient device is applied can be controlled so that the applied voltage, V, is less than the corresponding value for ionization as given by the Paschen curve. For example, during use, a voltage gradient can be applied in a region where the pressure times the distance over which the voltage gradient is applied is less than about $1\times10^{-2}$ Torr-inches (e.g., less than about $1\times10^{-2}$ Torr-inches, less than about $1\times10^{-3}$ Torr-inches, less than about $1\times10^{-4}$ Torr-inches) or greater than about 100 Torr-inches, (e.g., greater than 100 Torr-inches, greater than 500 Torr-inches, greater than 750 Torr-inches, greater than 1000 Torr-inches). For example, during use, the voltage gradient can be applied at a location where the gas within the gas delivery system is at an intermediate pressure such as a pressure of less than about $1\times10^{-2}$ Torr (e.g., less than about $1\times10^{-2}$ Torr, less than about $1\times10^{-3}$ Torr, less than about $1\times10^{-4}$) or greater than about 100 Torr (e.g., greater than 100 Torr, greater than 500 Torr, greater than 750 Torr, greater than 1000 Torr).

In certain embodiments, the gas can be introduced into vacuum vessel 204 through one ore more orifices in one of the electrodes (e.g., emitter 208, extractor 214, and/or suppressor 212). In such embodiments, a voltage gradient applied to the gas delivery system can provide a gradient from the potential of gas supply 220 to a potential about equal to a potential of the electrode (e.g., emitter 208, extractor 214, and/or suppressor 212).

In certain embodiments, the gas can be introduced into vacuum vessel 204 through one or more orifices in extractor 214 and a voltage gradient applied to a portion of the gas delivery system prior to extractor 214 can be a gradient from the potential of gas supply 220 to a potential about equal to a potential of extractor 214. For example, a maximum absolute value of the potential of the voltage gradient can be within about 20% of a maximum absolute value of a potential of the extractor (e.g., within about 15% of a potential of the extractor, within about 10% of a potential of the extractor, within about 5% of a potential of the extractor, within about 3% of a potential of the extractor, within about 1% of a potential of the extractor).

After the voltage gradient is applied to a gas delivery system, the gas delivery system delivers the gas into housing 202 of the ion microscope through extractor 214. Delivering the gas through extractor 214 allows the gas to delivered at a location near emitter 208 and directed toward emitter 208. In addition, since the voltage gradient is applied prior to the gas reaching extractor 208 the gas delivery system is at a potential about equal to the potential of the extractor in the vicinity of the extractor allowing extractor 214 to be negatively or positively biased (e.g., negatively or positively biasing the extractor at a potential from about −20 kV to about +50 kV) without causing the gas to experience a large electric field in a region where the gas is at an intermediate pressure.

In certain embodiments, the gas can be introduced into vacuum vessel 204 through an orifice in emitter 208 and a voltage gradient applied to a portion of the gas delivery system prior to emitter 208 can be a gradient from the potential of gas supply 220 to the potential about equal to a potential of emitter 208. For example, a maximum absolute value of the potential of the voltage gradient can be within about 20% of a maximum absolute value of a potential of the emitter (e.g., within about 15% of a potential of the emitter, within about 10% of a potential of the emitter, within about 5% of a potential of the emitter, within about 3% of a potential of the emitter, within about 1% of a potential of the emitter).

In certain embodiments, the gas can be introduced into vacuum vessel 204 through an orifice in suppressor 212 and a voltage gradient can be a gradient from the potential of gas supply 220 to the potential about equal to a potential of suppressor 212. For example, a maximum absolute value of the potential of the voltage gradient can be within about 20% of a maximum absolute value of a potential of the suppressor (e.g., within about 15% of a potential of the suppressor, within about 10% of a potential of the suppressor, within about 5% of a potential of the suppressor, within about 3% of a potential of the suppressor, within about 1% of a potential of the suppressor).

In certain embodiments, the voltage gradient can be a gradient having a magnitude of at least about 5 kV (e.g., at least about 5 kV, at least about 10 kV, at least about 15 kV, at least about 20 kV, at least about 25 kV).

Figure 9:
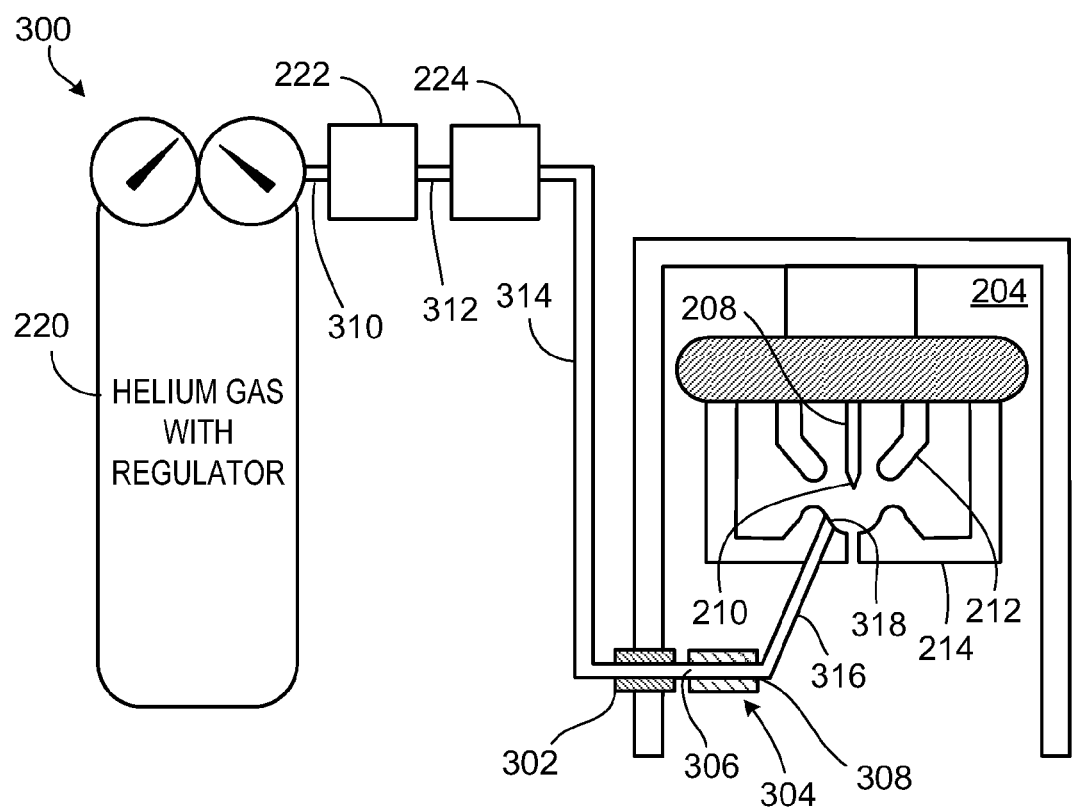
FIGS. 9-12 are schematic diagrams showing a portion of an ion microscope system.

FIG. 9 shows a system 300 that includes gas supply 220 and housing 202 that contains, among other items, emitter 208 and extractor 214 of an ion microscope. The system 300 also includes a gas delivery system that transports a gas (e.g., a noble gas such as Helium) from gas supply 220 to an orifice 318 in extractor 214 within housing 202. The gas delivery system includes a gas purifier 222 and a flow control device 224. The gas delivery system also includes a gas feed through device 302 that allows the gas to flow through a wall of the housing 202 and into vacuum chamber 204. Once inside housing 202, the gas delivery system includes a voltage gradient application device 304 that applies a voltage gradient to the tube or pipe in which the gas flows.

During use, the gas delivery system remains at grounded potential (e.g., zero volts) from gas supply 220, through gas purifier 222, through flow control mechanism 224, and even into vacuum vessel 204. Once inside vacuum vessel 204, voltage gradient device 304 applies a voltage gradient across an insulating tube. The voltage gradient spans from the potential of gas supply 220 to the potential present on extractor 214. For example, an end of the tube 306 nearer to gas supply 220 on the gas delivery path is at the potential of gas supply 220 (e.g., grounded) while an end of the tube 308 nearer to orifice 318 is at the potential similar to that of extractor 316 (e.g., at a high potential). The insulating tube can be formed of a variety of materials such as glass, Teflon, and/or a commercial ceramic such as alumina. The length of the tubing is such that a high voltage breakdown does not occur through the gas or along its surface. Within this tube (e.g., the portion of the gas delivery system at which the voltage gradient is applied) the gas is either at low pressure (e.g., less than about $1\times10^{-2}$ Torr) at a high pressure (e.g., greater than about 100 Torr). More generally, the pressure of the gas in the gradient region is chosen so that the voltage is below the Paschen curve. For large voltages>5 keV, this is either in the low pressure region (e.g., p×d<$10^{-2}$ torr inches) or the high pressure region (e.g., p×d>500 torr inches).

In one example, flow control mechanism 224 decreases the pressure of the gas in the gas delivery system to a low pressure (e.g., less than about $1\times10^{-2}$ Torr). In such embodiments, the gas is delivered from gas supply 220 at a high pressure and is reduced to a low pressure by flow control mechanism 224 such that the gas is at a high pressure in portions prior to flow control mechanism 224 (e.g., portions 310, 222, and 312) and at a low pressure in portions of the gas delivery subsequent to flow control mechanism 224 (e.g., portions 314, 302, 304, and 316). Because voltage gradient device 304 is provided on a portion of the gas delivery system where the gas within the gas delivery system is at a low pressure, the likelihood of continuous ionization due to the electric field generated by the voltage gradient is diminished. Further, the length of the gas delivery system over which the voltage gradient is applied is selected such that, for the applied voltage, the pressure multiplied by the length is less than about $10^{-2}$ torr inches.

In another example, flow control mechanism 224 does not significantly decrease the pressure of the gas in the gas delivery system but rather maintains the gas at a high pressure (e.g., greater than 100 Torr). In such embodiments, the gas is delivered from gas supply 220 at a high pressure and remains at a high pressure prior to exiting orifice 318 into vacuum chamber 204. As such the voltage gradient device 204 is provided on a portion of the gas delivery system where the gas within the gas delivery system is at a high pressure and the likelihood of continuous ionization due to the electric field generated by the voltage gradient is diminished. Further, the length of the gas delivery system over which the voltage gradient is applied is selected such that, for the applied voltage, the pressure multiplied by the length is greater than about 500 torr inches.

Figure 10:
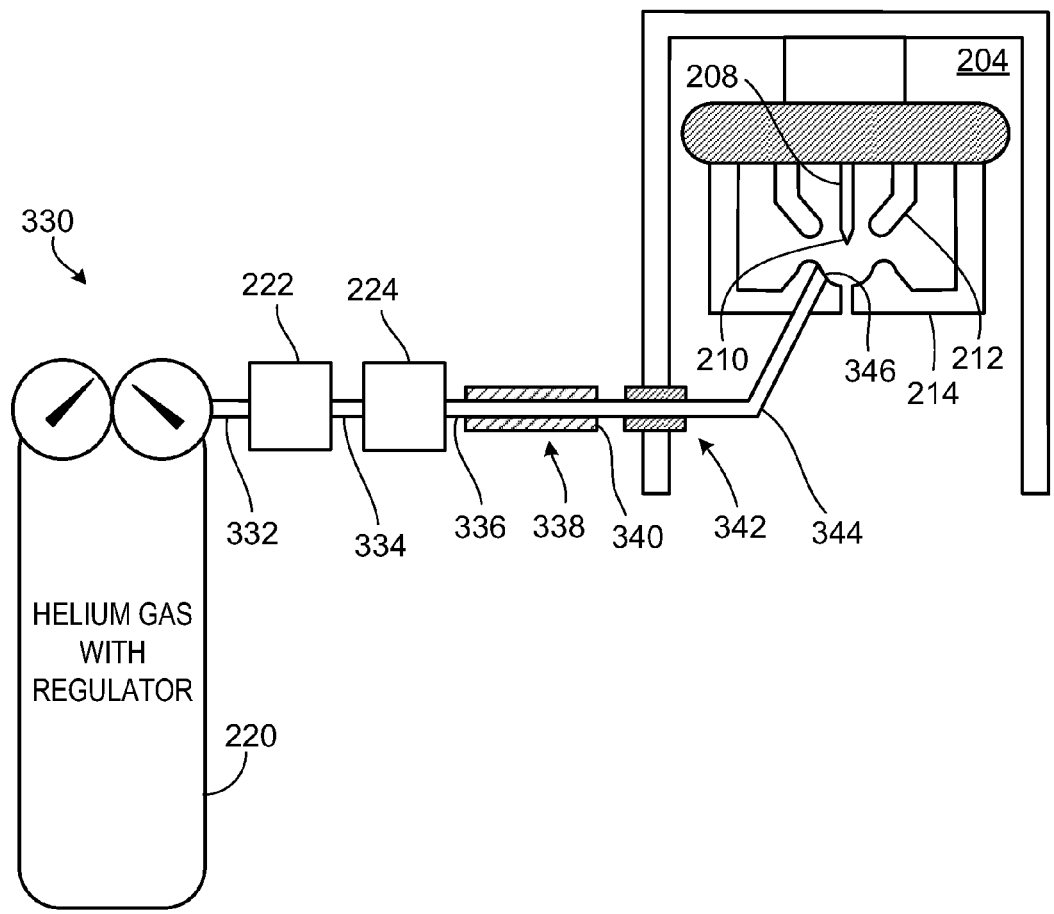

FIG. 10 shows a system 330 similar to system 300 shown in FIG. 9 with the exception of the location of the voltage gradient application device. In system 300, voltage gradient application device 304 is located within vacuum chamber 204 (e.g., inside of housing 202) while in system 330, voltage gradient application device 338 is located prior to vacuum chamber 204 (e.g., outside of housing 202). Due to the application of the voltage gradient outside of housing 202, system 330 includes a high voltage/gas feed through 342. The a high voltage/gas feed through 342 allows the voltage of the gas delivery system after the voltage gradient device 342 to remain high while the housing is maintained at a grounded potential.

More particularly, system 330 includes a gas supply 220 and a housing 202 that contains, among other items, emitter 208 and extractor 214 of an ion microscope. The system 300 also includes a gas delivery system that transports a gas (e.g., a noble gas such as Helium) from gas supply 220 to an orifice 346 in extractor 214. The gas delivery system can include a gas purifier 222 and a flow control device 224. The gas delivery system also includes a voltage gradient application device 338 that applies a voltage gradient to the tube in which the gas flows. The voltage gradient application device 338 is located on a portion of the gas delivery system outside of housing 202. As such, a high voltage/gas feed through device 342 allows the gas to flow through a wall of the grounded housing 202 and into vacuum chamber 204.

During use, the gas delivery system remains at grounded potential (e.g., zero volts) from gas supply 220, through gas purifier 222, and through flow control mechanism 224. Voltage gradient device 338 applies a voltage gradient across an insulating tube which spans from the voltage of gas supply 220 to the high voltage present on extractor 214. For example, the voltage gradient device 338 maintains an end of the tube 336 nearer to gas supply 220 on the gas delivery path at the potential of gas supply 220 (e.g., grounded) while maintaining an end of the tube 340 nearer to orifice 346 at or near the potential of extractor 214 (e.g., at a high potential). The insulating tube can be formed of a variety of materials such as glass, Teflon, and/or a commercial ceramic such as alumina. The length of the tubing should be such that a high voltage breakdown does not occur through the gas or along its surface. Within this tube (e.g., the portion of the gas delivery system at which the voltage gradient is applied) the gas is either at low pressure (e.g., less than $1\times10^{-3}$ Torr) at a high pressure (e.g., greater than about 100 Torr). For example, the flow control mechanism 224 can be used to modify or select the pressure of the gas at the location of voltage gradient device 338 as described above. More generally, the pressure of the gas in the gradient region is chosen so that the voltage is below the Paschen curve. For large voltages>5 keV, this is either in the low pressure region (e.g., p×d<$10^{-2}$ torr inches) or the high pressure region (e.g., p×d>500 torr inches).

Figure 11:
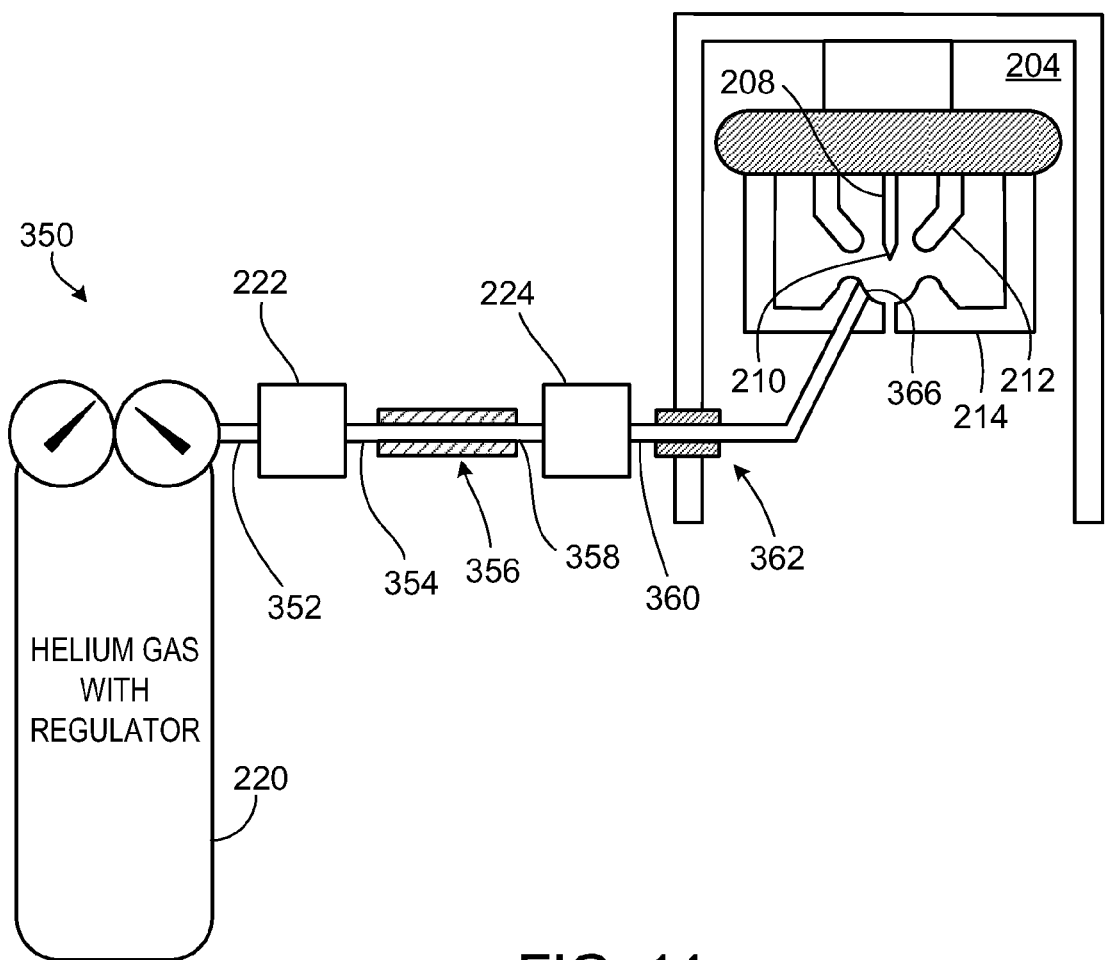

FIG. 11 shows a system 350 that is similar to systems 300 and 330 shown in FIGS. 9 and 10 with the exception of the location of the voltage gradient application device. In system 350, voltage gradient application device 356 is located prior to vacuum chamber 204 (e.g., outside of housing 202) before flow control device 224. Due to the application of the voltage gradient outside of the housing 202, system 330 includes a high voltage/gas feed through 356 to allow the gas delivery system to remain at a high potential while passing through the grounded housing 202.

More particularly, system 350 includes a gas supply 220 and a housing 202 that contains, among other items, an emitter 208 and an extractor 214 of an ion microscope. The system 350 also includes a gas delivery system that transports a gas (e.g., a noble gas such as Helium) from gas supply 220 to an orifice 366 in extractor 214. The gas delivery system includes a gas purifier 222, a flow control device 224, and a voltage gradient application device 356 that applies a voltage gradient to the tube in which the gas flows. The voltage gradient application device 356 is located on a portion of the gas delivery system outside of housing 202 before the flow control device 224. The gas delivery system remains at grounded potential (e.g., zero volts) from gas supply 220 and through gas purifier 222. Thereafter, there voltage gradient application device 356 which spans from ground potential to the high voltage present on the extractor electrode raises the voltage of the gas delivery system to the voltage present on extractor 214. A high voltage/gas feed through device 362 allows the gas to flow through a wall of the grounded housing 202 and into vacuum chamber 204.

During use, the gas (e.g., the helium gas) remains at grounded potential (zero volts) from gas storage bottle 220 and through the gas purifier 222. Prior to flow control device 224, voltage gradient device 356 applies a voltage gradient across an insulating tube which spans from a potential of the grounded gas supply to the high potential present on extractor 214. For example, an end of the tube 354 nearer to gas supply 220 on the gas delivery path is at the potential of the gas supply 220 (e.g., grounded) while an end of the tube 358 nearer to the gas flow device 224 is at or near the potential of extractor 214 (e.g., at a high potential). The insulating tube can be formed of a variety of materials such as glass, Teflon, and/or a commercial ceramic such as alumina. The length of the tubing should be such that a high voltage breakdown does not occur through the gas or along its surface.

Within this tube (e.g., the portion of the gas delivery system at which the voltage gradient is applied) the gas is at a high pressure (e.g., greater than about 500 Torr). More particularly, the gas exits gas supply 220 at a high pressure and is maintained at the high pressure in regions of the gas delivery system prior to flow control mechanism 224. More generally, the pressure of the gas in the gradient region is chosen so that the voltage applied by the voltage gradient device is below the Paschen curve. In this example, for large voltages>5 keV, this is in a high pressure region (e.g., p×d>500 torr inches). Further, the length of the gas delivery system over which the voltage gradient is applied is selected such that, for the applied voltage, the pressure multiplied by the length is greater than about 500 torr inches. Subsequent to the gas passing through voltage gradient device 356, the flow control mechanism 224 decreases the pressure of the gas in the gas delivery system to a low pressure (e.g., less than $1\times10^{-2}$ Torr). Because voltage gradient device 356 is provided on a portion of the gas delivery system where the gas within the gas delivery system is at a high pressure, the likelihood of continuous ionization is diminished.

Figure 12:
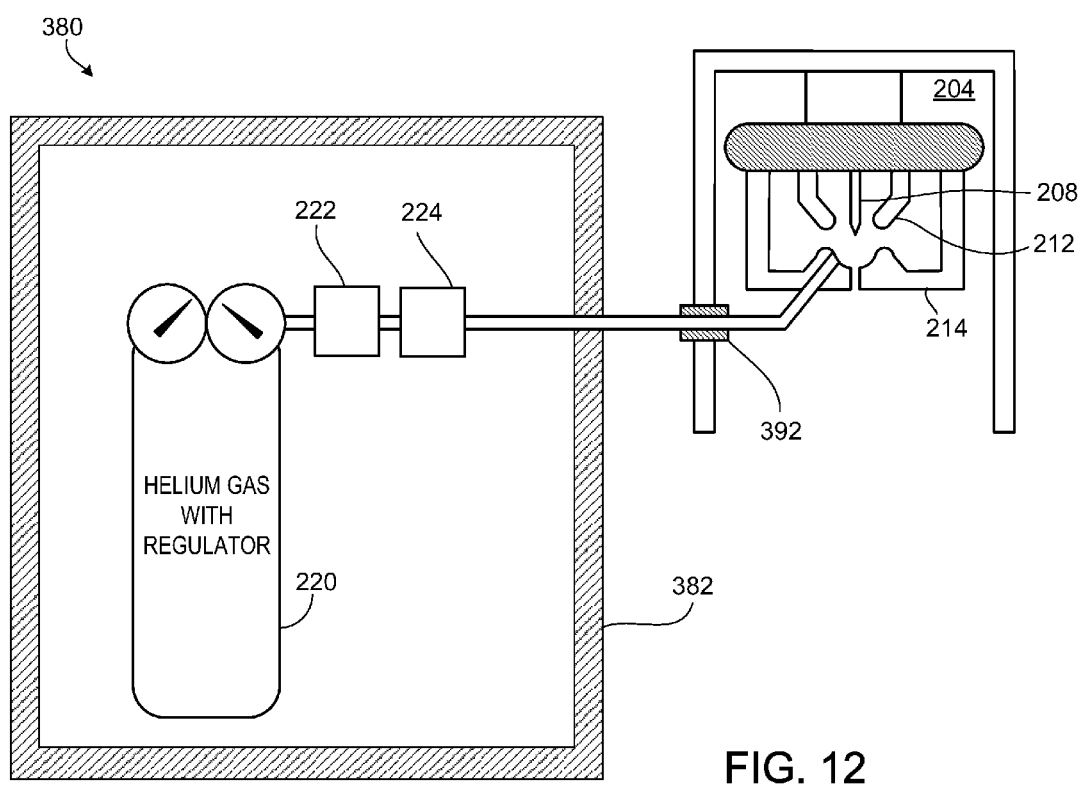

FIG. 12 shows a system 380 in which the entire gas delivery system including gas supply 220 is biased to a voltage similar to the voltage of extractor 214. Since the entire gas delivery system is maintained at a high voltage, for safety purposes the gas system can be electrically insulated by conventional and established techniques. For example, the electrical power and sensors are electrically isolated for example using transformers and other isolating methods. In this example, the gas and the gas delivery system is uniformly biased, so it experiences little or no electric field along its gas path, and hence there is little risk of ionization even though the pressure drops substantially along its gas path and in doing so passes through regions of intermediate pressures.

While in the embodiments described above, the gas delivery system delivers the gas through extractor 214, in some additional embodiments, the gas delivery system can deliver the gas through another electrode such as emitter 208 or suppressor 212. If the gas delivery system delivers the gas through another electrode such as emitter 208 or suppressor 212, the voltage gradient device can apply a voltage gradient from the potential of the gas supply to the potential about equal to that of the another electrode such (e.g., emitter 208 or suppressor 212). For example, a maximum absolute value of the potential of the voltage gradient can be within about 20% of a maximum absolute value of a potential of the emitter or suppressor electrode (e.g., within about 15% of a potential of the emitter or suppressor electrode, within about 10% of a potential of the emitter or suppressor electrode, within about 5% of a potential of the emitter or suppressor electrode, within about 3% of a potential of the extractor, within about 1% of a potential of the emitter or suppressor electrode).

In some circumstances, during use of the systems described above, there may be times in which the voltage has to be turned off during transition times when the gas pressure may pass through the intermediate pressure range. For example, the pressure of the gas in the gradient region is above the Paschen curve. For large voltages>5 keV, this can be at intermediate pressures (e.g., $10^{-2}$ torr inches<p×d<100 torr inches). A bypass mechanism can be provided to assist in this transitional period so that the gas will not experience the voltage gradient while at the intermediate pressure.

While in the embodiments described above, the pressure was lowered either by a flow control device 224 or by an orifice at the exit of the gas delivery system, in some embodiments, fixed orifices can additionally or alternatively be incorporated throughout the gas path to establish the location where the pressure drops.

While in the embodiments described above, the gas delivery system was described generally as introducing the gas into the chamber through an orifice in the emitter, extractor and/or suppressor, the gas can be introduced through a plurality of orifices in the emitter, extractor and/or suppressor. In general, the emitter, extractor and/or suppressor can include any desired number of channels and orifices for introducing the gas. For example, the emitter, extractor and/or suppressor can include at least 2 orifices (e.g., at least 2 orifices, at least 3 orifices, at least 5 orifices, at least 10 orifices).

Figure 13:
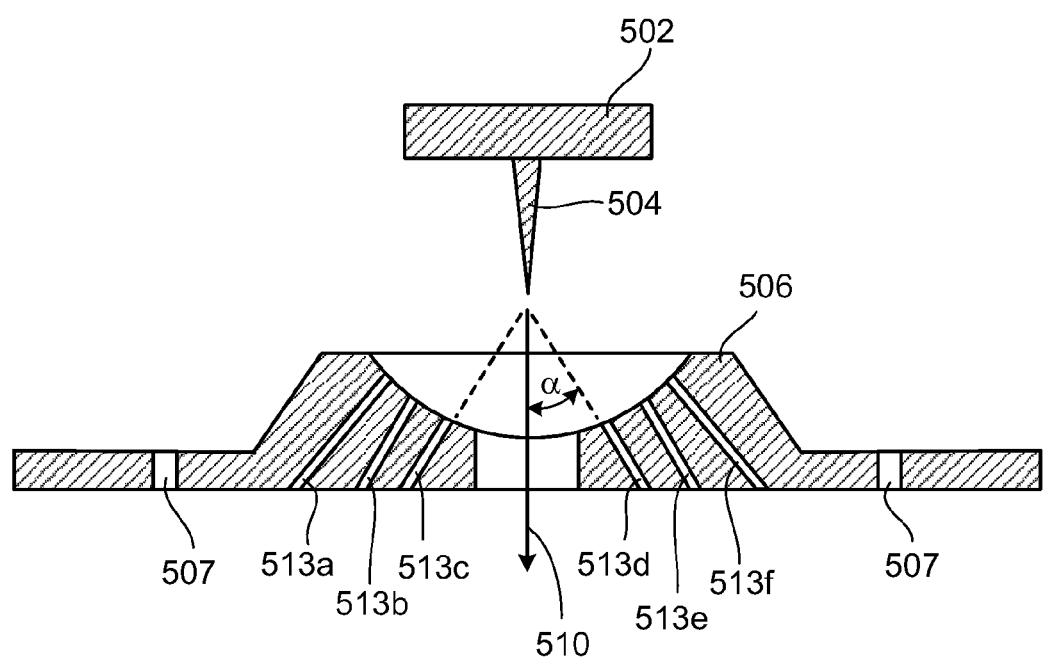
FIG. 13 is a schematic diagram of an extractor that includes a plurality of channels and orifices.

For example, FIG. 13 shows an embodiment of an extractor 506 that includes a plurality of channels and orifices 513a-f formed in the extractor, and oriented to direct feed gas 182 toward tip 504. Six channels and orifices are shown in FIG. 5. In general, however, extractor 506 can include any desired number of channels and orifices for introducing feed gas. By positioning channels and orifices 513a-f within extractor 506, the feed gas may be directed more efficiently to tip 504 than for other arrangements of gas inlets. In particular, shadowing effects—which can arise when feed gas is introduced along trajectories that are nearly tangent to the surface of tip 504, and which can reduce the efficiency of feed gas ionization—can be reduced and/or eliminated. In some embodiments, to avoid shadowing effects and to promote efficient feed gas ionization, an angle a between an axis of a gas channel (e.g., any of channels 513a-f) and the ion beam propagation direction (e.g., shown by arrow 510) is 60 degrees or less (e.g., 50 degrees or less, 40 degrees or less, 30 degrees or less, 20 degrees or less, 10 degrees or less).

Computer Hardware and Software

In general, any of the methods described above—including adjustment of a feed gas supply to a charged particle source, mechanical adjustment of a field shunt, and adjustment of electrical potentials applied to elements such as tips, field shunts, and extractors—can be implemented by electronic control system in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

Other Embodiments

The charged particle sources discussed previously are typically gas field ion sources. In general, however, the field shunts disclosed herein can be used in other charged particle systems, including liquid metal ion sources (LMISs), electron beam sources, and other types of ion sources.

Although helium and other noble gas particles are discussed previously for use in producing charged particle beams, in general, a wide variety of different gas particles can be used, including noble gas atoms, metal atoms, various diatomic, triatomic, and more generally, polyatomic gas particles, and various heteronuclear gas particles.

Other embodiments are in the claims.

What is claimed is:

1. A method, comprising:
applying a voltage gradient to a gas delivery system;
delivering a gas through a length of the gas delivery system having the voltage gradient, the gas having a pressure-distance product of less than about $1 \times 10^{-2}$ Torr-inches; and
then delivering the gas into a housing of an ion microscope, the housing including an emitter and an extractor,
wherein the gas pressure in the length of the gas delivery system having the voltage gradient is less than about $1 \times 10^{-2}$ Torr.

2. The method of claim 1, wherein applying the voltage gradient comprises applying the voltage gradient without ionizing the gas.

3. The method of claim 1, wherein delivering the gas into the housing comprises delivering the gas through an orifice in an electrode the electrode being one of the emitter, the extractor or an suppressor.

4. The method of claim 3, wherein a maximum absolute value of the potential of the voltage gradient is within about 20% of a maximum absolute value of a potential of the electrode.

5. The method of claim 1, further comprising:
prior to applying the voltage gradient, reducing a pressure of the gas in the gas delivery system, wherein reducing the pressure comprises reducing the pressure to a pressure of less than about $1 \times 10^{-2}$ Torr.

6. The method of claim 5, wherein:
delivering the gas into the housing comprises delivering the gas through an orifice in an electrode the electrode being one of the emitter, the extractor or an suppressor; and
a maximum absolute value of the potential of the voltage gradient is within about 20% of a maximum absolute value of a potential of the electrode.

7. The method of claim 5, wherein applying the voltage gradient comprises applying a voltage gradient of greater than about 5 kV.

8. The method of claim 1, wherein applying the voltage gradient comprises applying a voltage gradient of greater than about 5 kV.

9. The method of claim 1, wherein delivering the gas into a housing of an ion microscope comprises delivering the gas through a plurality of orifices.

10. A system, comprising:
an ion microscope having a housing containing an emitter, an extractor and a suppressor, at least one of the emitter, extractor and suppressor having an orifice; and
a gas delivery system configured to provide a path for gas flow between a gas supply and the orifice, the gas delivery system including a device configured to apply a voltage gradient across a portion of the gas delivery system,
wherein the device is at a location of the gas delivery system configured to maintain the gas at a pressure of less than about $1 \times 10^{-2}$ Torr.

11. The system of claim 10, wherein the at least one of the emitter, extractor and suppressor includes a plurality of orifices and the gas delivery system is configured to provide a path for gas flow between the gas supply and the plurality of orifices.

12. The system of claim 10, wherein the gas delivery system further comprises a tube configured to transport the gas, and the device configured to apply the voltage gradient is attached to a portion of the tube.

13. The system of claim 10, wherein the gas delivery system further comprises a flow controller, wherein the flow controller is configured to reduce the pressure of the gas to less than $1 \times 10^{-2}$ Torr.

14. The system of claim 13, wherein the flow controller is positioned on a gas delivery path between the gas supply and the device configured to apply the voltage gradient.

15. The system of claim 10, wherein the orifice comprises an orifice in an electrode forming one of the emitter, the extractor or the suppressor.

16. The system of claim 10, further comprising:
a flow control device configured to reduce the pressure of a gas, the flow control device being located prior to the device configured to apply a voltage gradient, wherein the device is at a location of the gas delivery system configured to maintain the gas in the gas delivery system at a pressure of less than about $1 \times 10^{-2}$ Torr.

17. The system of claim 16, wherein the device configured to apply a voltage gradient is configured to apply a voltage gradient with maximum absolute value of a potential of the voltage gradient within about 20% of a maximum absolute value of a potential of the electrode.

18. The system of claim 10, wherein:
the at least one of the emitter, extractor and suppressor includes a plurality of orifices;
the gas delivery system is configured to provide a path for gas flow between the gas supply and the plurality of orifices;
the gas delivery system further comprises a tube configured to transport the gas;

the device configured to apply the voltage gradient is attached to a portion of the tube;

the gas delivery system further comprises a flow controller; and the flow controller is configured to reduce the pressure of the gas to less than $1 \times 10^{-2}$ Torr.

19. The system of claim 18, wherein, during use, the device is configured to apply a voltage gradient of at least 5 kV across the portion of the gas delivery system.

20. The system of claim 19, wherein the flow controller is positioned on a gas delivery path between the gas supply and the device configured to apply the voltage gradient.

21. The method of claim 1, wherein the ion microscope is a gas field ion microscope.

22. The system of claim 10, wherein the ion microscope is a gas field ion microscope.

* * * * *

UNITED STATES PATENT AND TRADEMARK OFFICE
CERTIFICATE OF CORRECTION

PATENT NO. : 8,558,192 B2
APPLICATION NO. : 13/276836
DATED : October 15, 2013
INVENTOR(S) : Billy W. Ward et al.

Page 1 of 1

It is certified that error appears in the above-identified patent and that said Letters Patent is hereby corrected as shown below:

In the Specification:

Col. 1, line 42, delete "Pascen" and insert -- Paschen --.

Col. 8, line 47, delete "10-2" and insert -- $10^{-2}$ --.

Col. 9, line 67, delete "ore" and insert -- or --.

Col. 12, line 4, delete "The a" and insert -- A --.

In the Claims:

Col. 17, line 10, delete "claim 19," and insert -- claim 18, --.

Signed and Sealed this
Eleventh Day of February, 2014

Michelle K. Lee
*Deputy Director of the United States Patent and Trademark Office*